US008836024B2

(12) United States Patent
Padmanabhan et al.

(10) Patent No.: US 8,836,024 B2
(45) Date of Patent: Sep. 16, 2014

(54) ELECTRONIC DEVICE INCLUDING A TRENCH AND A CONDUCTIVE STRUCTURE THEREIN HAVING A CONTACT WITHIN A SCHOTTKY REGION AND A PROCESS OF FORMING THE SAME

(75) Inventors: Balaji Padmanabhan, Tempe, AZ (US); James Sellers, Chandler, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 218 days.

(21) Appl. No.: 13/425,030

(22) Filed: Mar. 20, 2012

(65) Prior Publication Data

US 2013/0248992 A1 Sep. 26, 2013

(51) Int. Cl.
H01L 29/78 (2006.01)
H01L 21/336 (2006.01)

(52) U.S. Cl.
USPC .............. 257/334; 257/E29.26; 257/E21.419; 438/272

(58) Field of Classification Search
CPC ............ H01L 29/7813; H01L 29/4236; H01L 29/66734
USPC .............. 257/334, E29.26, E21.419; 438/272
See application file for complete search history.

(56) References Cited

U.S. PATENT DOCUMENTS 6,998,678 B2    2/2006  Werner et al.
8,044,461 B2   10/2011  Session
2005/0145936 A1*  7/2005  Polzl et al. .................... 257/341
2006/0209887 A1*  9/2006  Bhalla et al. .................. 370/466
2007/0034901 A1*  2/2007  Lui et al. ....................... 257/197
2008/0246082 A1* 10/2008  Hshieh .......................... 257/333
2009/0065855 A1*  3/2009  Bhalla et al. .................. 257/328
2009/0283798 A1* 11/2009  Tsuzuki et al. ............... 257/140
2009/0315106 A1* 12/2009  Hsieh ............................ 257/334
2010/0072544 A1*  3/2010  Pearse et al. .................. 257/331
2011/0084335 A1*  4/2011  Lin et al. ....................... 257/334
2011/0266613 A1* 11/2011  Venkatraman et al. ....... 257/327
2011/0316076 A1* 12/2011  Lee et al. ...................... 257/332
2012/0098057 A1*  4/2012  Kim et al. ..................... 257/330
2013/0075808 A1*  3/2013  Calafut et al. ................ 257/328
2013/0221428 A1*  8/2013  Venkatraman et al. ....... 257/330
2013/0221436 A1*  8/2013  Hossain et al. ............... 257/334

* cited by examiner

Primary Examiner — Steven J Fulk
(74) Attorney, Agent, or Firm — Abel Law Group, LLP

(57) ABSTRACT

An electronic device can include a transistor structure, including a patterned semiconductor layer overlying a substrate, wherein the patterned semiconductor layer defines first and second trenches. The electronic device can also include a first conductive structure within the first trench, a gate electrode within the first trench and overlying the first conductive structure, a first insulating member within the second trench, and a second conductive structure within the second trench. The second conductive structure can include a first portion and a second portion overlying the first portion, the first insulating member can be disposed between the patterned semiconductor layer and the first portion of the second conductive structure; and the second portion of the second conductive structure can contact the patterned semiconductor layer at a Schottky region. Processes of forming the electronic device can take advantage of integrating formation of the Schottky region into a contact process flow.

20 Claims, 9 Drawing Sheets

ELECTRONIC DEVICE INCLUDING A TRENCH AND A CONDUCTIVE STRUCTURE THEREIN HAVING A CONTACT WITHIN A SCHOTTKY REGION AND A PROCESS OF FORMING THE SAME

RELATED ART

Metal-oxide-semiconductor field-effect transistors (MOSFETs) are a common type of power switching device. A MOSFET includes a source region, a drain region, a channel region extending between the source and drain regions, and a gate structure provided adjacent to the channel region. The gate structure includes a gate electrode layer disposed adjacent to and separated from the channel region by a thin dielectric layer.

In optimizing the performance of a MOSFET, a designer is often faced with trade-offs in device parameter performance. Specifically, available device structure or fabrication process choices may improve one device parameter, but at the same time such choices may degrade one or more other device parameters or cause the cell pitch to become significantly larger. For example, available structures and processes that improve figure of merit, that is, on-resistance times total gate charge of a MOSFET, may increase the size of the die, and smaller die size may have a higher figure of merit.

BRIEF DESCRIPTION OF THE DRAWINGS

Embodiments are illustrated by way of example and are not limited in the accompanying figures.

Figure 1:
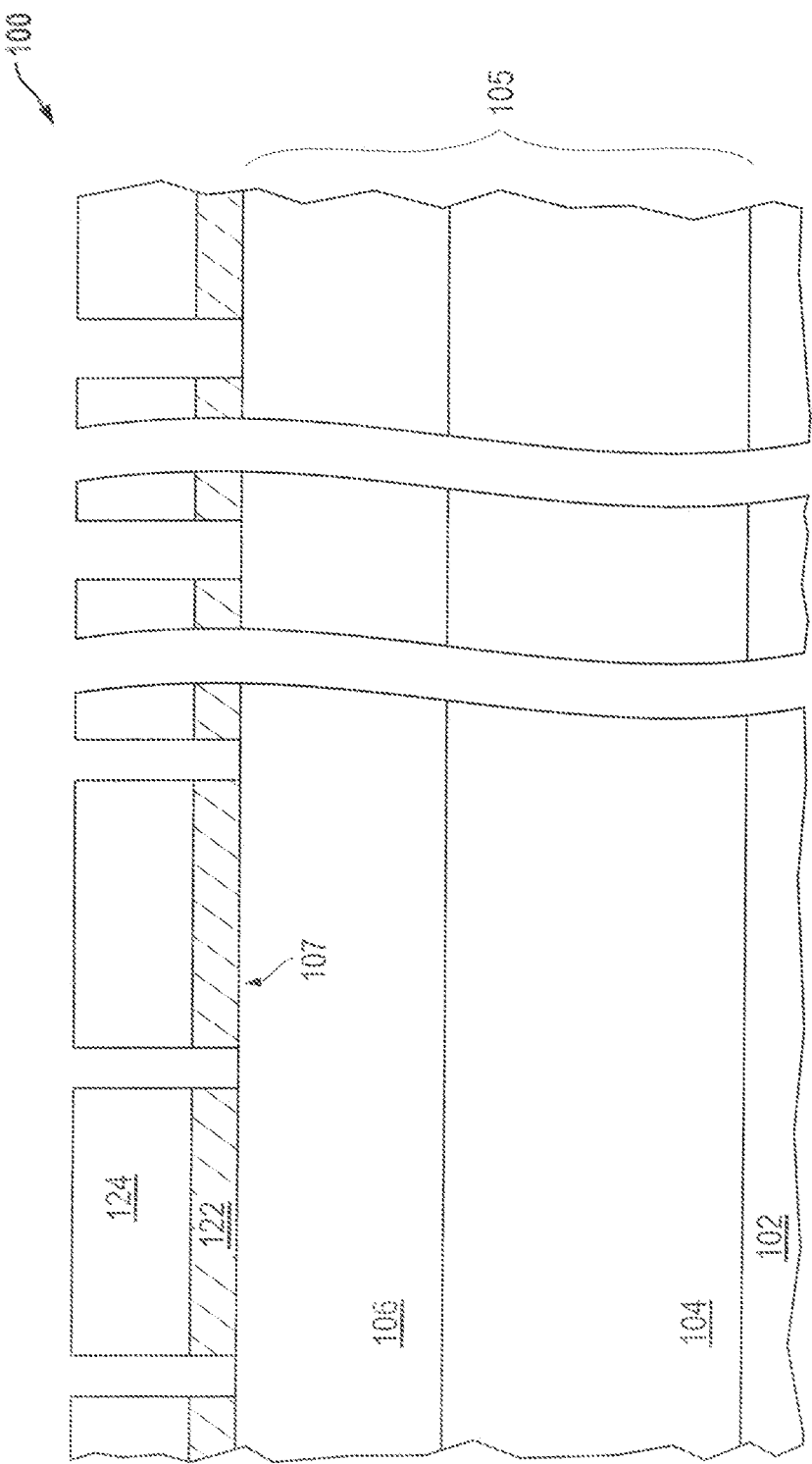
FIG. 1 includes an illustration of a cross-sectional view of a portion of a workpiece that includes an underlying doped region, semiconductor layers, a hardmask layer, and a patterned resist layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

As used herein, the term "channel length" is intended to mean the distance between a source region and a drain region of a transistor structure that is measured substantially parallel to the current flow through a channel region during normal operation. The term "channel width" is intended to mean a dimension of the channel region that is measured in a direction orthogonal to the channel length.

The term "normal operation" and "normal operating state" refer to conditions under which an electronic component or device is designed to operate. The conditions may be obtained from a data sheet or other information regarding voltages, currents, capacitance, resistance, or other electrical conditions. Thus, normal operation does not include operating an electrical component or device well beyond its design limits.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single item is described herein, more than one item may be used in place of a single item. Similarly, where more than one item is described herein, a single item may be substituted for that more than one item.

Group numbers corresponding to columns within the Periodic Table of the elements use the "New Notation" convention as seen in the *CRC Handbook of Chemistry and Physics,* 81$^{st}$ Edition (2000-2001).

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include conductive structures within trenches within an active area that are between the gate electrodes within other trenches. The conductive structures may allow better depletion properties and be part of Schottky junctions with Schottky regions of a semiconductor layer. The Schottky diodes at the Schottky junctions help to lower reverse recovery charge and forward voltage ($V_F$). Reduced switch node ringing in buck convertors may also be improved.

As described herein, the Schottky diodes may be integrated into the process flow without increasing cell pitch (gate-to-gate) as much as for other approaches for a designed or particular $V_F$. The amount of Schottky regions may be determined by processing consideration. Thus, leakage current, as measured by $I_{DSS}$ when the transistor structures are in the off-state, can be reduced compared to many other conventional transistor structures. Further, the formation of the conductive structures can be integrated as part of a conductive plug process when forming contact plugs. The benefits and details of the electronic device are better understood after reading the embodiments, as described in detail below.

FIG. 1 includes an illustration of a cross-sectional view of a portion of a workpiece 100. The workpiece 100 includes an underlying doped region 102 that is part of a substrate that may be lightly doped or heavily doped, n-type or p-type. For the purposes of this specification, heavily doped is intended to mean a peak dopant concentration of at least $10^{19}$ atoms/cm$^3$. The underlying doped region 102 can be a portion of a heavily doped substrate (e.g., a heavily n-type doped wafer) or may be a buried doped region overlying a base layer of opposite conductivity type or overlying a buried insulating layer (not illustrated) that lies between the base layer and the buried doped region. In an embodiment, the underlying doped region 102 is heavily doped with an n-type dopant, such as phosphorus, arsenic, antimony, or any combination thereof. In a particular embodiment, the underlying doped region 102 includes arsenic or antimony if diffusion of the underlying doped region 102 is to be kept low.

In the embodiment illustrated in FIG. 1, a semiconductor layer 104 overlies the underlying doped region 102 and can include a Group 14 element (for example, carbon, silicon, germanium, or any combination thereof) and any of the dopants as described with respect to the underlying doped region 102 or dopants of the opposite conductivity type. In an embodiment, the semiconductor layer 104 is a moderately doped n-type or p-type epitaxial silicon layer having a thickness in a range of approximately 0.5 microns to approximately 4.0 microns, and a doping concentration no greater than approximately $10^{18}$ atoms/cm$^3$, and in another embodiment, a doping concentration of least approximately $10^{16}$ atoms/cm$^3$.

The workpiece 100 can further include another semiconductor layer 106 that overlies the semiconductor layer 104. The semiconductor layer 106 can include a Group 14 element (i.e., carbon, silicon, germanium, or any combination thereof) and any of the dopants as described with respect to the semiconductor layer 104. In an embodiment, the semiconductor layer 106 is a lightly doped n-type or p-type epitaxial silicon layer having a thickness in a range of approximately 0.5 microns to approximately 3.0 microns, and a doping concentration no greater than approximately $10^{17}$ atoms/cm$^3$, and in another embodiment, a doping concentration of least approximately $10^{15}$ atoms/cm$^3$. The doping concentration of the semiconductor layer 106 at this point in the process flow may be referred to as the background doping concentration. The semiconductor layer includes a primary surface 107 that is spaced apart from underlying doped region. The combination of the semiconductor layers 104 and 106 are illustrated as semiconductor 105 in subsequent figures.

A hardmask layer 122 and a resist layer 124 are formed over the semiconductor layer 106. The hardmask layer 122 is used as a masking layer during a subsequent trench etch. The hardmask layer 122 can include an oxide, a nitride, an oxynitride, or any combination thereof. In an embodiment, the hardmask layer 122 can include a single film or a plurality of films (for example, an oxide film covered by a nitride film).

The hardmask layer 122 has a thickness sufficient to withstand a subsequently trench etch, and in an embodiment has a thickness in a range of approximately 110 nm to approximately 900 nm. The hardmask layer 122 can be formed using a thermal growth technique, a deposition technique, or a combination thereof. A resist layer 124 is formed over the hardmask layer 122 and is patterned to form openings corresponding to locations where trenches will be subsequently formed. An etch is performed to pattern the hardmask layer 122 as illustrated in FIG. 1. The resist layer 124 is then removed.

Figure 2:
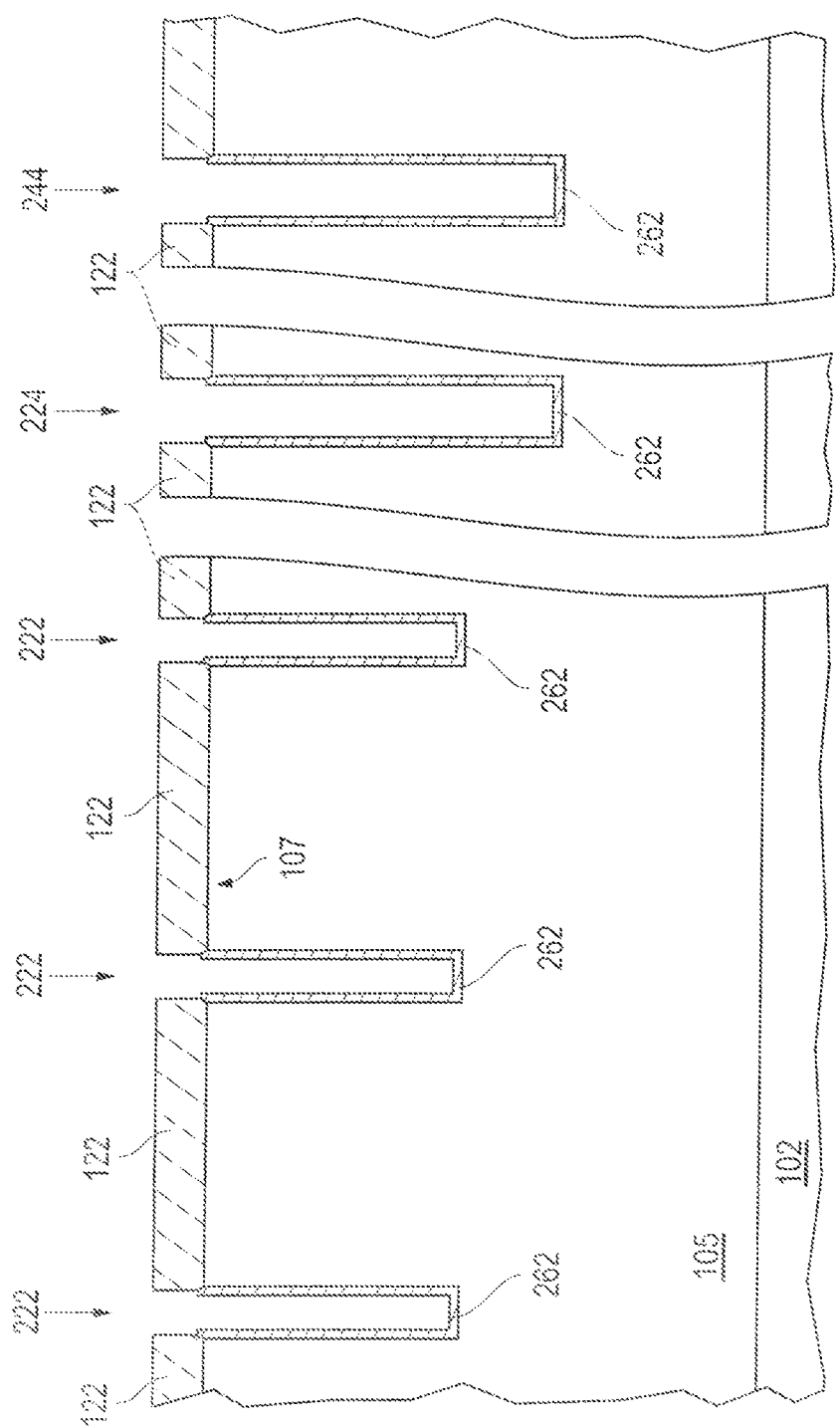
FIG. 2 includes an illustration of a cross-sectional view of the workpiece of FIG. 1 after forming trenches and an insulating layer within the trenches.

In FIG. 2, the semiconductor layer 105 is etched to define trenches 222, 224, and 244 that extend from the primary surface 107 towards the underlying doped region 102. Trenches 222 are at locations where transistor structures will be formed, and trenches 224 and 244 are at locations where a gate feed area and a conductive electrode contact area. The trenches 222, 224, and 244 have depths in a range approximately 1.1 to approximately 3.0 microns. In another embodiment, the trenches can extend to a depth that is in a range of approximately 25% to approximately 75% of the thickness of the semiconductor layer 105. The widths of the trenches 222, 224, and 244 may be a range of approximately 0.1 micron to approximately 0.9 micron. In an embodiment, the trenches 222 are narrower than the widths of the trenches 224 and 244. The trenches 222, 224, and 244 can have substantially the same depth or may have different depths as illustrated in FIG. 2. If needed or desired, a thermal oxide 262 may be grown and to help round the corners of the trenches 222, 224, and 244 near the primary surface 107 and bottoms of the trenches 222, 224, and 244. The hardmask layer 122 and the thermal oxide 262 are removed.

Figure 3:
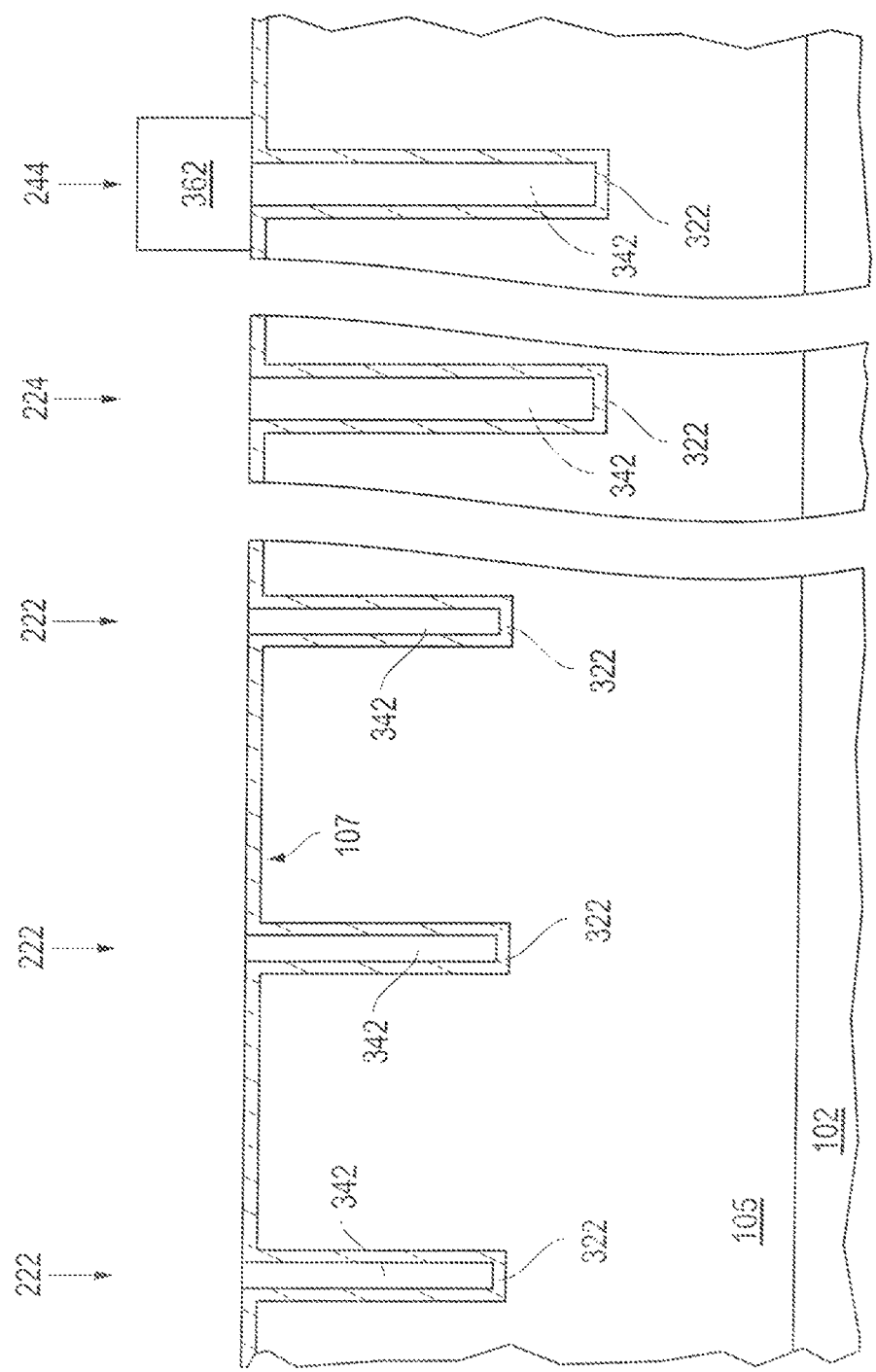
FIG. 3 includes an illustration of a cross-sectional view of the workpiece of FIG. 2 after forming conductive structures within the trenches and a patterned resist layer over a particular conductive structure and trench.

FIG. 3 includes an illustration of a cross-sectional view after forming an insulating layer 322, conductive structures 342, and a patterned resist layer 362. The insulating layer 322 is formed along exposed portions of the semiconductor layer 105. The insulating layer 322 partly, but does not completely, fill the trenches 222, 224, and 244. The insulating layer 322 can include an oxide, a nitride, an oxynitride, or any combination thereof. In an embodiment, the insulating layer 322 can include a single insulating film, and in another embodiment, the insulating layer 322 can include a plurality of insulating films. The insulating layer 322 has a thickness in a range of approximately 70 nm to approximately 150 nm. The insulating layer 322 can be grown or deposited.

A conductive layer is formed over the insulating layer 322 and within the trenches 222, 224, and 244. The conductive layer substantially fills remaining portions of the trenches 222, 224, and 244. The conductive layer can include a metal-containing or semiconductor-containing material. In an embodiment, the conductive layer can include a heavily doped semiconductor material, such as amorphous silicon or polysilicon. In another embodiment, the conductive layer includes a plurality of films, such as an adhesion film, a barrier film, and a conductive fill material. In a particular embodiment, the adhesion film can include a refractory metal, such as titanium, tantalum, or the like; the barrier film can include a refractory metal nitride, such as titanium nitride, tantalum nitride, or the like, a refractory silicide, such as tungsten silicide, titanium silicide, or the like, or a refractory metal-semiconductor-nitride, such as TaSiN; and the conductive fill material can include tungsten. In a more particular embodiment, the conductive layer can include Ti/TiN/W. The selection of the number of films and composition(s) of those film(s) depend on electrical performance, the temperature of a subsequent heat cycle, another criterion, or any combination thereof. Refractory metals and refractory metal-containing compounds can withstand high temperatures (e.g., melting points of such materials can be at least 1400° C.), may be conformally deposited, and have a lower bulk resistivity than heavily doped n-type silicon. After reading this specification, skilled artisans will be able to determine the composition of the conductive layer to meet their needs or desires for a particular application.

A portion of the conductive layer that overlies the insulating layer 322 outside of the trenches 222, 224, and 244 is removed to form conductive structures 342 within the trenches 222, 224, and 244, as illustrated in the embodiment of FIG. 3. The removal can be performed using a chemical-mechanical polishing or blanket etching technique. The insulating layer 322 may be used as a polish-stop or etch-stop layer. A resist layer is formed over the insulating layer 322 and conductive structures 342 and patterned to form the patterned resist layer 362 that overlies the trench 244 and its conductive structures 342.

Figure 4:
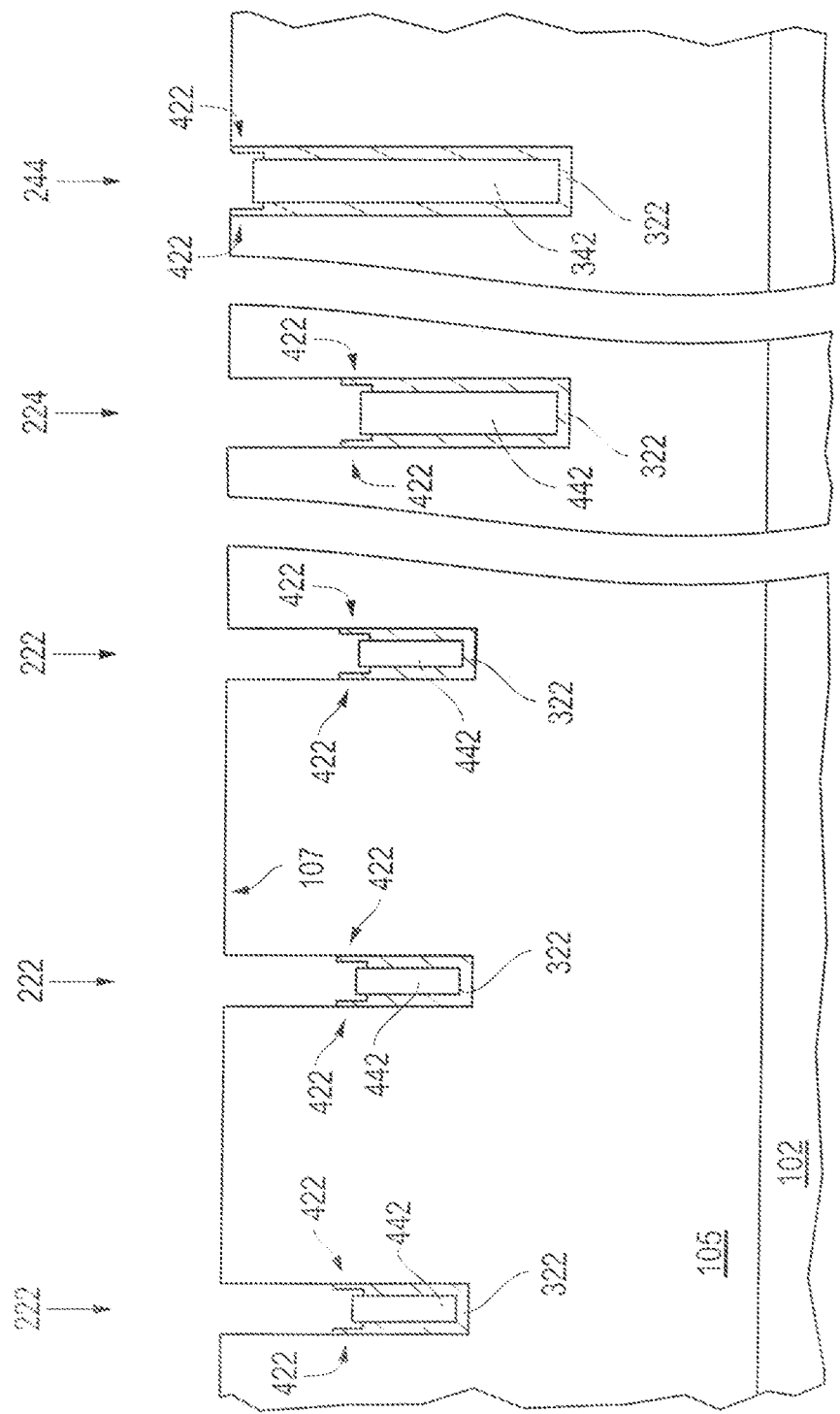
FIG. 4 includes an illustration of a cross-sectional view of the workpiece of FIG. 3 after removing portions of some of the conductive structures and forming insulating stubs.

The exposed portions of the conductive structures 342 within the trenches 222 and 224 are recessed to form conductive structures 442 within the trenches 222 and 224, as illustrated in FIG. 4. The removal may be performed using a wet or dry etching technique. The patterned resist layer 362 is then removed. Some of the exposed portions of the insulating layer 322 can then be removed; however, the semiconductor layer 105 remains protected by remaining portions of the insulating layer 322. The conductive structures 342 and 442 are recessed within the trenches 222, 224, and 244. The highest elevations of the conductive structures 342 and 442 lie below an elevation of the primary surface 107. The top of the conductive structure 342 can be in a range of approximately 0.1 to 0.2 microns below the primary surface 107, and the tops of the conductive structures 442 can be approximately 0.6 micron to approximately 1.3 microns below the primary surface 107. When expressed as a percentage of a depth of a corresponding trench (that is, the trench in which a particular conductive structure is disposed), the conductive structures 342 can be in a range of approximately 70% to approximately 99% of the depth of their corresponding trenches, and the conductive structures 442 can be in a range of approximately 30 to 60% of the depths of their corresponding trenches. As will be subsequently described, the tops of the conductive structures 442 are designed to be at elevations below subsequently-formed body regions, and the top of the conductive structure 342 is at an elevation within or higher than a subsequently-formed body region. A combination of the conductive structures 342 and 442 can be part of a conductive electrode to help deplete more fully the portions of semiconductor layer 105 between the trenches 222 within the active area.

The portions of the insulating layer 322 that were previously thinned are removed to expose portions of the semiconductor layer 105, as illustrated in FIG. 4. Due to the sequence of removals with respect to the insulating layer 322, insulating stubs 422 that are parts of the remaining insulating layer 322 are formed within the trenches 222, 224, and 244. For the trenches 222 and 224, the insulating stubs 422 can help to reduce capacitive coupling between the subsequently-formed gate members and portions of the semiconductor layer 105 that are parts of the drain region. The reduced capacitive coupling helps to reduce the drain component ($Q_{GD}$) of $Q_G$ and can allow for the transistor structures to switch states (off-to-on or on-to-off) more quickly. If needed or desired, a sacrificial oxide can be grown and removed to remove any defects and reduce contamination and surface roughness on the sidewalls of the semiconductor layer 105 in the trench to help improve the quality of gate dielectric layer subsequently formed along the sidewalls and also the electrical performance of the gate dielectric layer.

Figure 5:
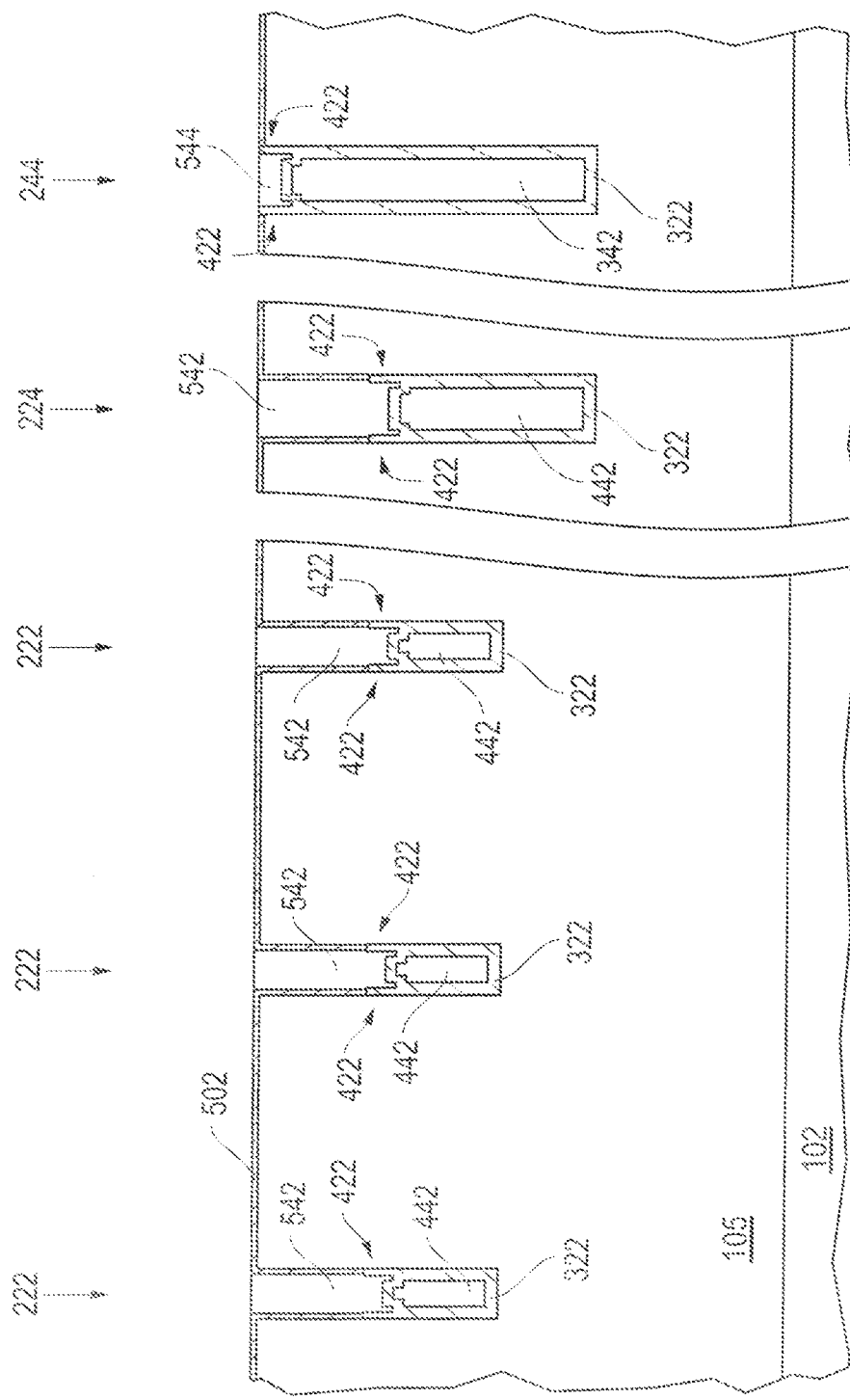
FIG. 5 includes an illustration of a cross-sectional view of the workpiece of FIG. 4 after forming a gate dielectric layer and gate members.

FIG. 5 includes an illustration of the workpiece after forming a gate dielectric layer 502, gate members 542, and a conductive structure 544. The gate dielectric layer 502 can include an oxide, a nitride, an oxynitride, or any combination thereof. In an embodiment, the hard mask can include a single film or a plurality of films (for example, an oxide film covered by a nitride film). The gate dielectric layer 502 can have a thickness in a range of approximately 11 nm to approximately 70 nm. The gate dielectric layer 502 can be formed using a thermal growth technique, a deposition technique, or a combination thereof.

A conductive layer is formed over the gate dielectric layer 502 and fills remaining portions of the trenches 222, 224, and 244. The conductive layer can include any of the materials, number of films, and be formed using any of the techniques previously described with respect to the conductive layer when forming the conductive structures 342. The conductive layer that overlies the gate dielectric layer 502 may have the same or different composition, include the same number or a different number of films, or be formed with the same or different technique as compared to the conductive layer used to form the conductive structures 342. After reading this specification, skilled artisans will be able to determine the composition of the conductive layer to meet their needs or desires for a particular application.

A portion of the conductive layer that overlies the gate dielectric layer 502 outside of the trenches 222, 224, and 244 is removed to form the gate members 542 within the trenches 222 and 224 and the conductive structure 544 within the trench 244, as illustrated in the embodiment of FIG. 5. The removal can be performed using a chemical-mechanical polishing or blanket etching technique. The gate dielectric layer 502 may be used as a polish-stop or etch-stop layer. The gate members 542 can include gate electrodes for the transistor structures. As can be seen in FIG. 5, the insulating stubs 422 help to displace the lower portions of the gate members 542 away from the semiconductor layer 105, and thus, capacitive coupling between the gate members 542 and portions of the drain region will be reduced. The conductive structure 544 is an artifact of the processing sequence and may be removed at a later processing operation.

Figure 6:
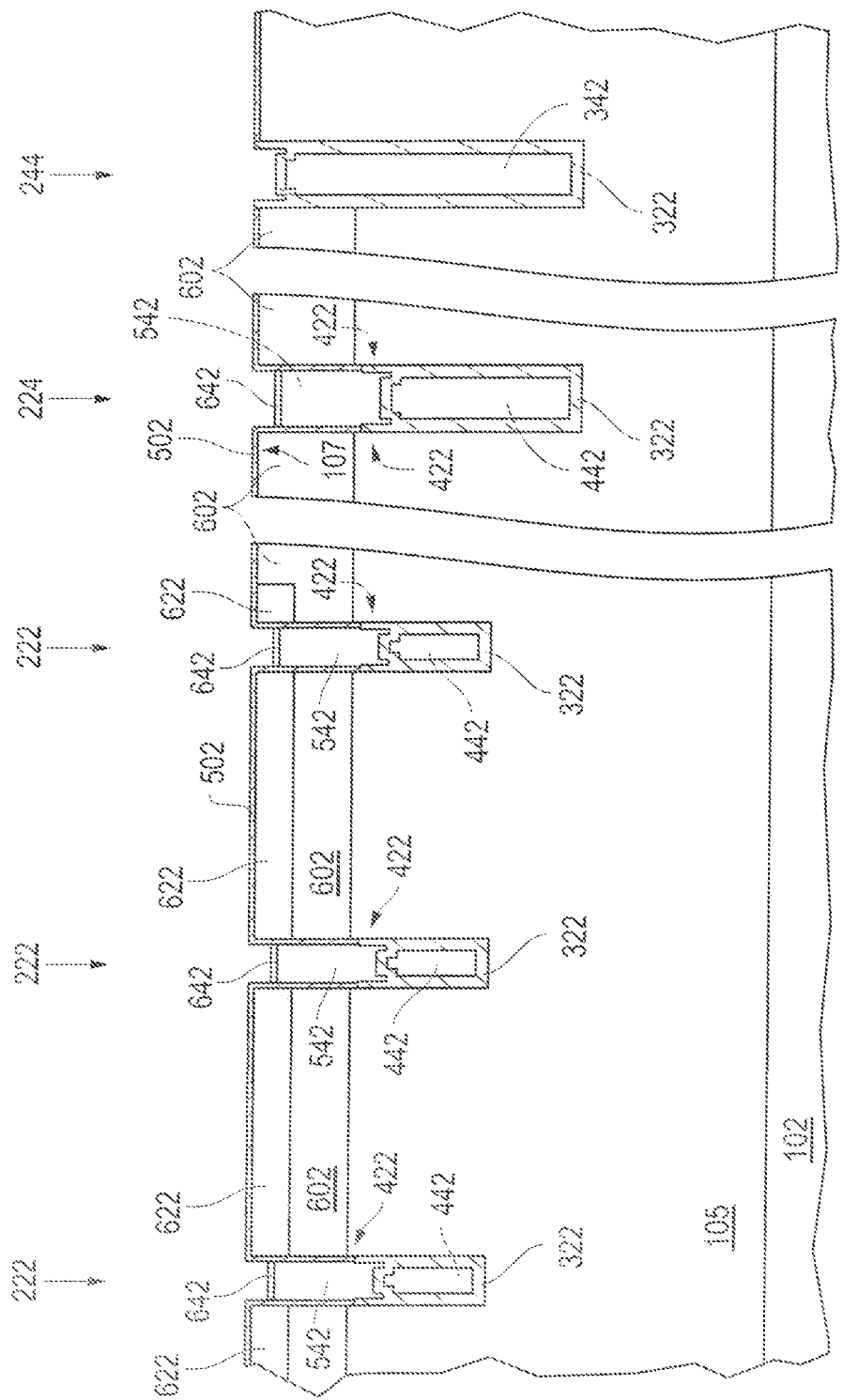
FIG. 6 includes an illustration of a cross-sectional view of the workpiece of FIG. 5 after forming body regions, source regions, and silicide members.

FIG. 6 includes an illustration of the workpiece after forming body regions 602, source regions 622, and silicide members 642. The body regions 602 include channel regions for the transistor structures. The body regions 602 have an opposite conductivity type as compared to the semiconductor layer 105. In an embodiment, within the active area, the elevations of the bottoms of the body regions 602 are above the elevations of the tops of the insulating stubs 422 within the trenches 222 and 224. In another embodiment, within the active area, the elevations of the bottoms of the body regions 602 are above the elevations lowermost points of the wider portions of the gate members 542, as illustrated in FIG. 6. The body regions 602 can have peak dopant concentrations in a range of approximately $5 \times 10^{16}$ atoms/cm$^3$ to approximately $1 \times 10^{18}$ atoms/cm$^3$ and extend to depths approximately 0.2 micron to approximately 0.9 micron from the primary surface 107. The body regions 602 can be formed with a single implant or with a chain of implants. In another embodiment, the body regions 602 can be replaced with a single body region within the active area.

The source regions 622 are formed from portions of the semiconductor layer 105 and are disposed over portions of the body regions 602. The source regions 622 have the same conductivity type as compared to the semiconductor layer 105 and opposite that of the body regions 602. The source regions 622 can have a peak dopant concentration of at least approximately $1 \times 10^{19}$ atoms/cm$^3$ and extend to depths approximately 0.05 micron to approximately 0.5 micron from the primary surface 107. The source regions 622 can be formed with an implant or another suitable technique. In another embodiment, the source regions 622 can be replaced with a single source region within the active area.

Portions of the gate members 542 and the conductive structure 544 (illustrated in FIG. 5) are removed. By recessing the gate members 542, capacitive coupling between the gate members 542 and the source regions 622 can be reduce and help to reduce the source component ($Q_{GS}$) of $Q_G$ and can allow for the transistor structures to switch states (off-to-on or on-to-off) more quickly. In the embodiment illustrated, silicide regions 642 are formed from or over the gate members 542. After the removal and within the active area, the tops of the gate members 542 are at elevations above elevations corresponding to the junctions between the body regions 602 and the source regions 622. In an embodiment, the tops of the gate members 542 are recessed approximately 0.03 micron to approximately 0.3 micron below the primary surface. The silicide regions may be omitted if needed or desired.

Figure 7:
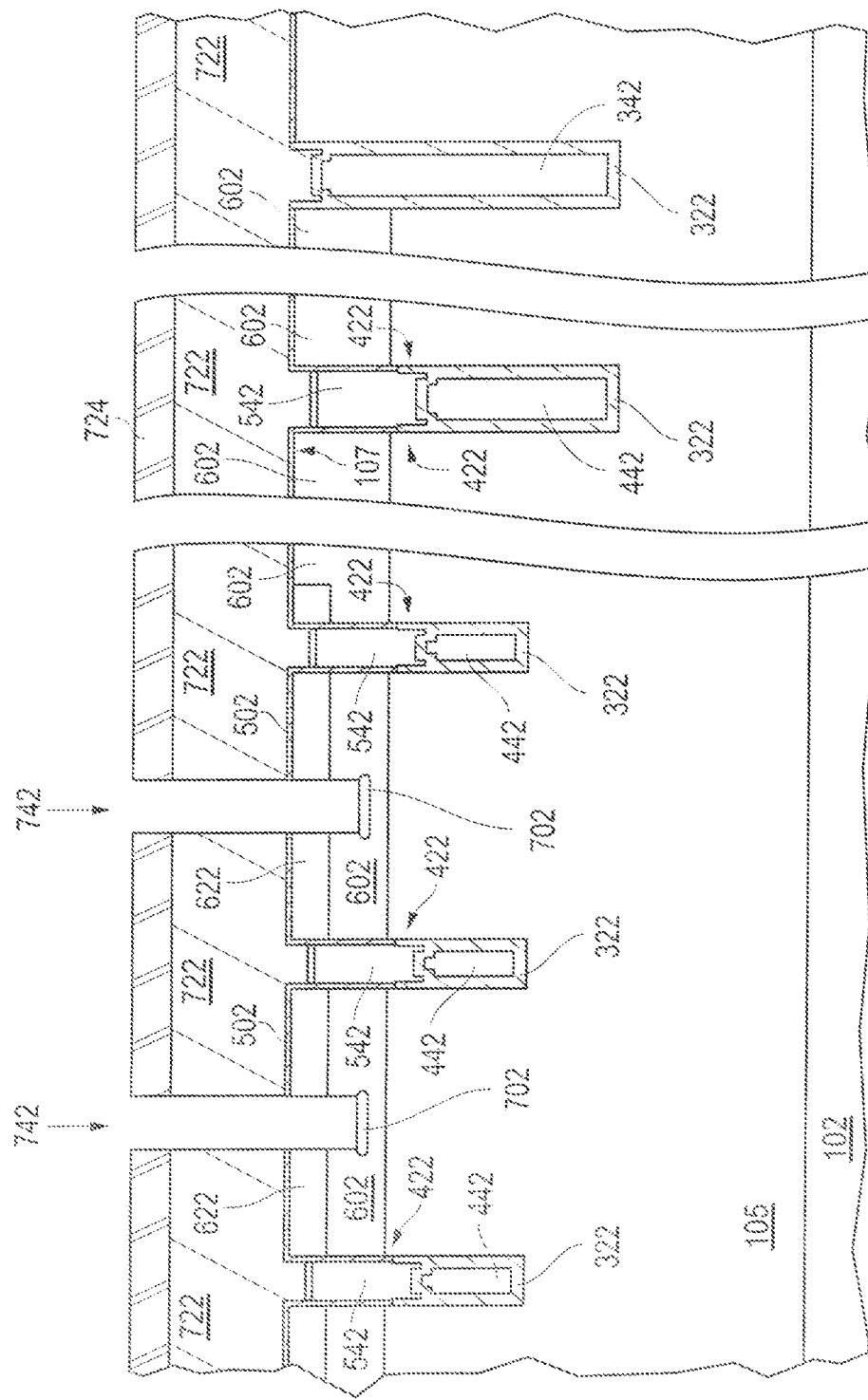
FIG. 7 includes an illustration of a cross-sectional view of the workpiece of FIG. 6 after forming an interlevel dielectric layer, openings, and body contact regions.

FIG. 7 includes an illustration of the workpiece after forming an interlevel dielectric ("ILD") layer 722, a hardmask layer 724, trenches 742, and body contact regions 702. The ILD layer 722 and hardmask layer 724 are formed and etched to define contact openings and trenches extending into the body regions 602 at locations between the gate members 542. The ILD layer 722 is formed over the workpiece and can include an oxide, a nitride, an oxynitride, or any combination thereof. The ILD layer 722 can include a single film having a substantially constant or changing composition (for example, a high phosphorus content further from the semiconductor layer 105) or a plurality of discrete films. An etch-stop layer, an antireflective layer, or a combination may be used within or over the ILD layer 722 to help with processing. The ILD layer 722 may be planarized to improve process margin during subsequent processing operations (e.g., lithography, subsequent polishing, or the like). In an embodiment, the ILD layer 722 has a thickness in a range of approximately 300 nm to approximately 1000 nm. The ILD layer 722 can be planarized using an etchback or polishing technique. The hardmask layer 724 is formed over the ILD layer 722 and can include an oxide, a nitride, and oxynitride, or a combination thereof. The hardmask layer 724 has a composition different from the ILD layer 722. In a particular embodiment, the ILD layer 722 includes an oxide, and the hardmask layer 724 includes a nitride. The thickness of the hardmask layer 724 can be in a range of approximately 50 nm to approximately 500 nm. A resist layer (not illustrated) is formed over the hardmask layer 724 and patterned to form openings extending through the hardmask layer 724, the ILD layer 722, and the gate dielectric layer 502. At this point in the process, contact openings are formed. The resist layer is then removed.

An etch is performed to form trenches 742 that extend from the primary surface 107 towards the underlying doped region 102. Dopant is introduced along the bottoms of the openings and diffused to form body contact regions 702 that are wider than the corresponding trenches 742. The body contact regions 702 have the same conductivity type as the body regions 602 and have a peak dopant concentration of at least $1 \times 10^{19}$ atoms/cm$^3$. Etching is continued to etch through portions of the body contact regions 702, the body regions 602, and etch into the semiconductor layer 105 to deepen the trenches 742. The trenches 742 may be substantially the same depth or shallower than the trenches that include the gate members 542 and conductive structures 442. In an embodiment, the trenches 742 can have depths in a range approximately 1.1 to approximately 3.0 microns. In another embodiment, the trenches can extend to a depth that is in a range of approximately 25% to approximately 75% of the thickness of the semiconductor layer 105. The widths of the trenches 742 may be a range of approximately 0.1 micron to approximately 0.9 micron. In an embodiment, the trenches 742 are narrower than the widths of the trenches 224. If needed or desired, a sacrificial oxide (not illustrated) may be grown and removed to help round the corners of the trenches 742 near the primary surface 107 and bottoms of the trenches 742.

Figure 8:
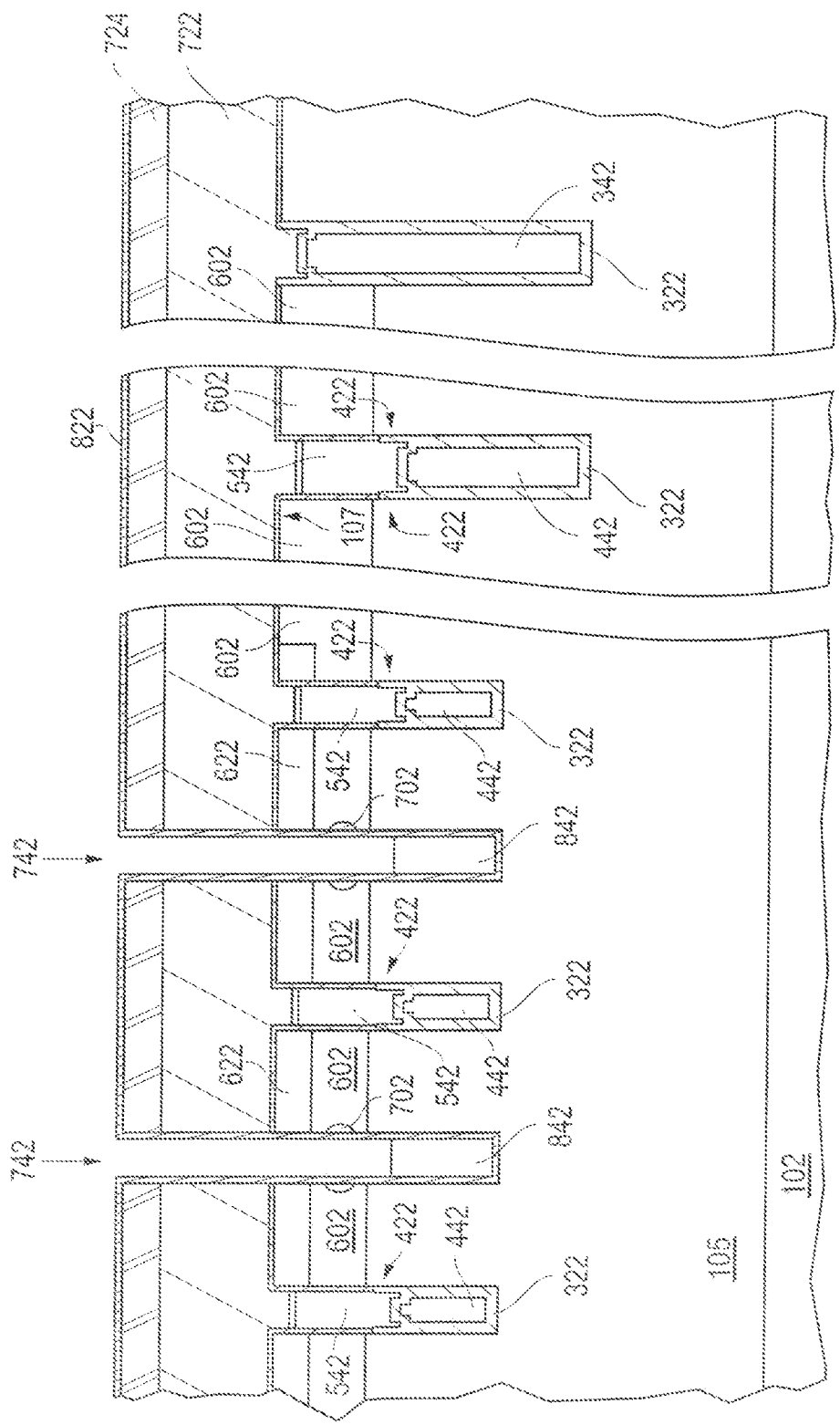
FIG. 8 includes an illustration of a cross-sectional view of the workpiece of FIG. 7 after forming an insulating layer and conductive structures.

FIG. 8 includes the electronic device after forming an insulating layer 822 and conductive members 842. The insulating layer 822 can be formed within the trenches 742. The insulating layer 822 can include any of the materials, number of films, and be formed using any of the techniques previously described with respect to the conductive layer when forming the insulating layer 322. The insulating layer 822 may have the same or different composition, include the same number or a different number of films, or be formed with the same or different technique as compared to the conductive layer used to form the insulating layer 322. After reading this specification, skilled artisans will be able to determine the composition of the insulating layer 822 to meet their needs or desires for a particular application.

A conductive layer for the conductive members 842 is formed adjacent to the insulating layer 822 and fills remaining portions of the trenches 742. The conductive layer can include any of the materials, number of films, and be formed using any of the techniques previously described with respect to the conductive layer when forming the conductive structures 342. The conductive layer for the conductive members 842 may have the same or different composition, include the same number or a different number of films, or be formed with the same or different technique as compared to the conductive layer used to form the conductive structures 342. After reading this specification, skilled artisans will be able to determine the composition of the conductive layer to meet their needs or desires for a particular application.

A portion of the conductive layer that lies outside of the trenches 742 is removed. Portions of the conductive layer within the trenches are removed to recess the conductive members 842 within the trenches. The removal can be performed using etching or a combination of a chemical-mechanical polishing (for portions of the conductive layer overlying the ILD layer 722) and etching. The tops of the conductive members 842 are below the elevation corresponding to the bottoms of the body regions 602 within the active area in the embodiment illustrated in FIG. 8. In an embodiment, the difference in elevations between the tops of the conductive members 842 and the bottoms of the body regions 602 is at least approximately 0.02 micron, at least approximately 0.04, or at least approximately 0.11 micron, and in another embodiment, the difference in elevations is no greater than approximately 0.5 micron, no greater than approximately 0.3 micron, or no greater than approximately 0.2 micron.

Figure 9:
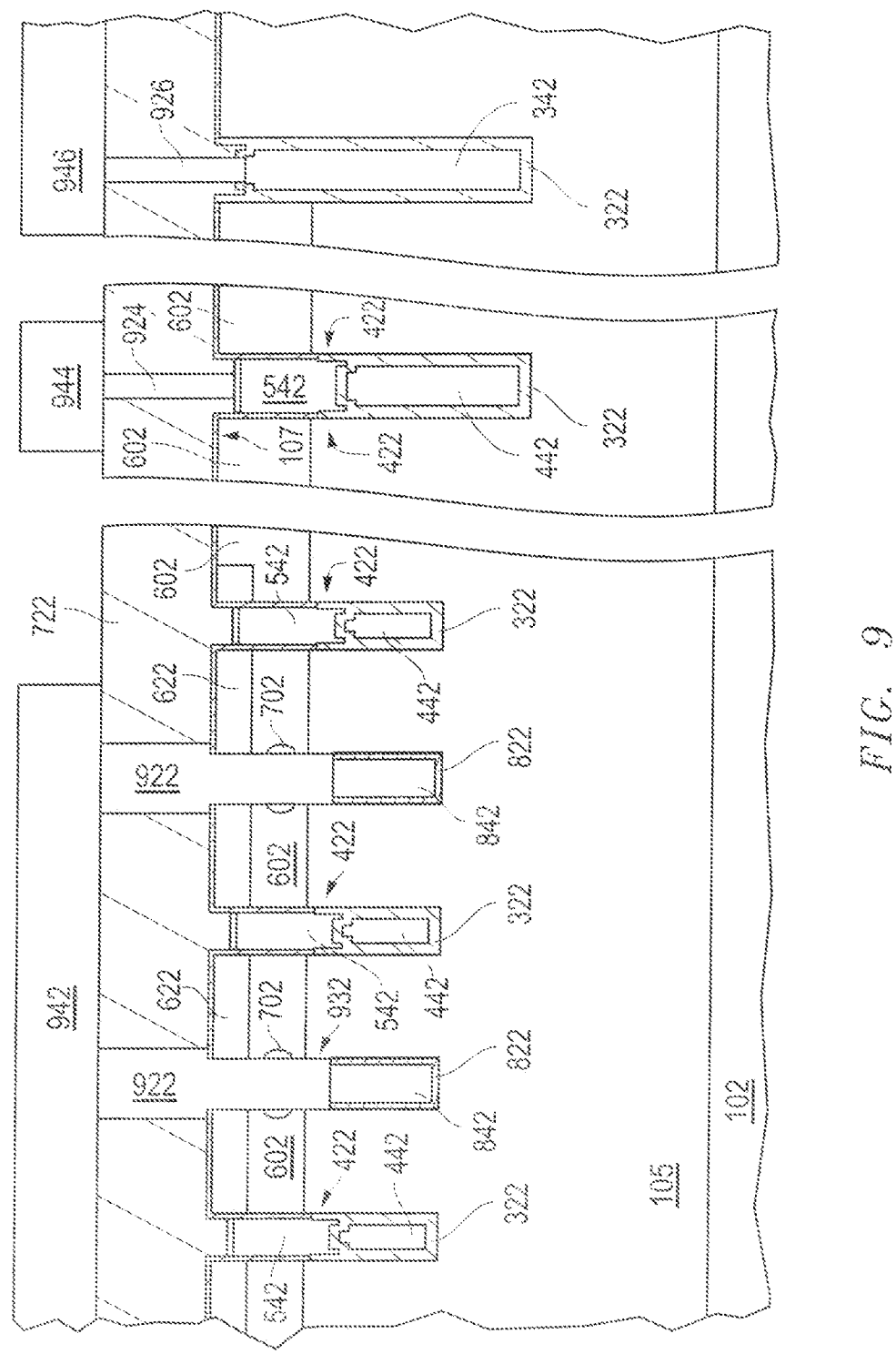
FIG. 9 includes an illustration of a cross-sectional view of the workpiece of FIG. 8 after forming a substantially completed electronic device.

FIG. 9 includes an illustration of a substantially completed electronic device that includes Schottky regions 932, conductive plugs 922, 924, and 926, and interconnect members 942, 944, and 946. Referring to FIG. 8, the insulating layer 822 lying at elevations above the tops of the conductive members 842 is removed. If needed or desire, an isotropic etch may be performed to expose top surfaces of the source regions 622 to help make better contact to the source regions 622. The hardmask layer 724 can be removed at this time. Alternatively, the hardmask layer 724 may remain if needed or desired for a particular application.

Conductive plugs 922 are formed by depositing a conductive layer and etching portions of the conductive layer outside the trenches 742. The conductive layer for the conductive plugs 922 can include any of the materials, films, or both as described with respect to the conductive layer for the conductive structures 342. In an embodiment, the conductive layer for the conductive plugs 922 has substantially the same composition and same number of films as compared to the conductive structures 342. In another embodiment, the conductive layer for the conductive plugs 922 has a different composition or a different number of films as compared to the conductive structures 342. After removing portions of the conductive layer lying outside the contact openings, the conductive plugs 922 are formed. Other conductive plugs similar to the conductive plugs 922 may be formed but are not illustrated in FIG. 9. Within the active area, the conductive plugs 922 electrically short the source regions 622, the body contact regions 702, and conductive members 842 to one another. Further, the conductive plugs 922 form Schottky regions 932 where the conductive plugs 922 contact the semiconductor layer 105. The size of the Schottky region generally corresponds to the perimeter of the corresponding trench 742 and to the difference in elevations between the tops of the conductive members 842 and bottoms of the body regions 602 adjacent to such corresponding trench 742.

The ILD layer 722 is patterned another time to define contact openings that extend through the ILD layer 722 to the silicide region 642 above the gate member 542 within the gate feed area and to the conductive structure 342 within the conductive electrode contact area. The etch can be performed as a timed etch or as an endpoint detected etch with a timed overetch. Conductive plugs 924 and 926 are formed by depositing a conductive layer and etching portions of the conductive layer outside the contact openings that extend through the ILD layer 722. The conductive layer for the conductive plugs 924 and 926 can include any of the materials, films, or both as described with respect to the conductive layer for the conductive plugs 922. In an embodiment, the conductive layer for the conductive plugs 924 and 926 has substantially the same composition and same number of films as compared to the conductive plugs 922. In another embodiment, the conductive layer for the conductive plugs 924 and 926 has a different composition or a different number of films as compared to the conductive plugs 922. After removing portions of the conductive layer lying outside the contact openings, the conductive plugs 924 and 926 are formed. Other conductive plugs may be formed but are not illustrated in FIG. 9. In another embodiment, the conductive plugs 922, 924, and 926 may be formed during the same processing operations. In a particular embodiment, the conductive structures 342, 442, and 842 can include polycrystalline silicon, and the conductive plugs 922, 924, and 925 can principally include tungsten.

An interconnect level can be formed and include interconnect members 942, 944, and 946. The interconnect member 942 is electrically connected to the conductive plugs 922 to the source regions 622, the body contact regions 702, and the conductive members 842, and Schottky regions 932. The interconnect member 944 within the gate feed area is electrically connected to the silicide region 642 and the gate member 542, which in turn is electrically connected to the gate members 542 within the active area. The interconnect member 946 within the conductive electrode area is electrically connected to the conductive plug 926 and conductive structure 342, which in turn is electrically connected to the conductive structures 442 within the active area. An electrode can include the conductive structures 342 and 442, and in a particular embodiment, can be a shield electrode. Although not illustrated, a drain contact may be formed to the backside of the workpiece to underlying doped region 102 or may be formed near the primary surface 107 if a topside contact is desired.

The interconnect members 942, 944, and 946 can be formed from a conductive layer can include any of the materials, films, or both as described with respect to the conductive layer for the conductive structures 342. In an embodiment, the conductive layer for the interconnect members 942, 944, and 946 has substantially the same composition and same number of films as compared to the conductive structures 342. In another embodiment, the conductive layer for the interconnect members 942, 944, and 946 has a different composition or a different number of films as compared to the conductive structures 342. In another embodiment, the conductive layer for the interconnect members 942, 944, and 946 can principally include aluminum, copper, or a noble metal. The thickness of the conductive layer can be in a range of approximately 0.5 micron to approximately 2.0 microns. The interconnect members 942, 944, and 946 can be formed using an in-laid technique or using a resist layer and a lithographic technique.

The interconnect member 942 can be electrically connected to a source terminal, which during normal operation may be at $V_{SS}$ or approximately ground potential. The interconnect member 944 can be electrically connected to a gate terminal or a gate controller within the electronic device. The interconnect member 946 can be electrically connected to a substantially constant voltage terminal, which during normal operation may be at $V_{SS}$, $V_{DD}$ for logic transistors (e.g., higher than $V_{SS}$ and no greater than approximately 5 V), or ground potential. When the interconnect members 942 and 946 are to be at the same potential during normal operation, the interconnect members 942 and 946 can be electrically connected to each other or may be replaced by a single interconnect member having different portions within the active area and the conductive electrode area.

The electronic device can include many transistor structures substantially similar to the transistor structures illustrated in FIG. 9 with the transistor structures connected in parallel with their corresponding gate members connected to the gate terminal or gate controller. All of the transistor structures can be power transistors.

In the finished device, conductive structures can include lower portions and upper portions. The lower portions, such as the conductive members 842, are spaced apart from the semiconductor layer 105 by insulating members, remaining portions of the insulating layer 822. The upper portions, such as the conductive plugs 922, directly contact the semiconductor layer 105 at the Schottky regions. In another embodiment, each pair of the conductive members 842 and the conductive plugs 922 can be replaced by a single conductive structure. For example, a sacrificial member would be formed in place of the conductive member 842 as illustrated in FIG. 8. For example, the insulating layer 822 may include an undoped oxide, and the sacrificial member may include a nitride. The sacrificial member would be formed as substantially described with respect to the conductive member 842. After removing portions of the insulating layer 822, the sacrificial member can be removed. The conductive layer used to form the conductive plugs 922 would also fill portions of the trench from which the sacrificial members were removed. Each trench 722 would have a single conductive structure that includes lower portions and upper portions that are substantially identical in shape to the conductive member 842 and conductive plug 922.

The Schottky regions 932 help to lower reverse recovery charge ($Q_{RR}$) and forward voltage ($V_F$). Reduced switch node ringing in buck convertors may also be improved with the Schottky regions 932. As described herein, the Schottky regions 932 may be integrated into the process flow without increasing cell pitch (gate-to-gate) as much as for other approaches for a designed or particular $V_F$. The amount of Schottky regions 932 may be controlled by reducing or increasing the size of the trenches 742, the etchback process in forming the conductive members 842, or a combination thereof. Thus, leakage current, as measured by $I_{DSS}$ when the transistor structures are in the off-state, can be reduced compared to many other conventional transistor structures. The conductive members 842, which can be part of a conductive electrode (e.g., a shield electrode), can help to deplete portions of the semiconductor layer 105 without increasing cell pitch, as compared to other approaches, such as the device described and illustrated in FIG. 4 of US 2007/0034901.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device comprising a transistor structure can include a patterned semiconductor layer overlying a substrate and having a primary surface, wherein the patterned semiconductor layer defines a first trench and a second trench that extend from the primary surface towards the substrate. The electronic device can further include a first conductive structure within the first trench, a gate electrode within the first trench and overlying the first conductive structure, a first insulating member within the second trench, and a second conductive structure within the second trench. The second conductive structure can include a first portion and a second portion overlying the first portion, the first insulating member can be disposed between the patterned semiconductor layer and the first portion of the second conductive structure; and the second portion of the second conductive structure can contact the patterned semiconductor layer at a Schottky region.

In an embodiment of the first aspect, the first trench is wider than the second trench. In another embodiment, within the second trench, the first portion of the second conductive structure is narrower than the second portion of the second conductive structure. In a further embodiment, the electronic device further includes a body region disposed over the Schottky region, a second insulating member disposed between the first conductive structure and patterned semiconductor layer, and a gate dielectric layer disposed between the gate electrode and the body region, wherein the gate dielectric layer is thinner than the second insulating member. In a particular embodiment, the electronic device further includes a source region disposed over the body region, and a body contact region within the body region and adjacent to the second trench, wherein the second conductive structure directly contacts the source region and the body contact region.

In still a further embodiment, the electronic device further includes another first trench defined by the patterned semiconductor layer, and another gate electrode within the other first trench, wherein the second trench and second conductive structure are disposed between the first trenches and first gate electrodes. In yet a further embodiment, the first portion of the second conductive structure and the second portion of the second conductive structure comprise different materials. In a particular embodiment, the first portion comprises doped polycrystalline silicon, and the second portion comprises tungsten. In another embodiment, the electronic device further includes a second insulating member between the first conductive structure and the gate electrode, wherein, in a finished device, the first conductive structure and the second conductive structure are electrically connected to each other.

In a second aspect, a process of forming an electronic device can include providing a workpiece including a semiconductor layer over a substrate, wherein the semiconductor layer has a primary surface. The process can further include patterning the semiconductor layer to define a first trench that extends from the primary surface towards the substrate, forming a first conductive structure within the first trench, and forming a gate electrode within the first trench after forming the first conductive structure. The process can still further include patterning the semiconductor layer to define a second trench that extends from the primary surface towards the substrate, forming a first insulating member within the second trench, and forming a second conductive structure within the second trench after forming the first insulating member. The second conductive structure can include a first portion and a second portion overlying the first portion, the first insulating member can be disposed between the patterned semiconductor layer and the first portion of the second conductive structure, and the second portion of the second conductive structure can contact the patterned semiconductor layer at a Schottky region.

In an embodiment of the second aspect, patterning the semiconductor layer to define the first trench defines another first trench, forming the gate electrode forms another gate electrode within the other first trench, and the second conductive structure is disposed within the semiconductor layer between the gate electrodes. In another embodiment, forming the first insulating member comprises forming a first insulating layer within the second trench, and removing a portion of the first insulating layer to form the first insulating member, wherein substantially all of the first insulating member within the second trench lies at an elevation below the primary surface.

In still another embodiment of the second aspect, the process further includes forming a body region within the semiconductor layer, wherein after forming the second conductive structure, the Schottky region is disposed at an elevation between the body region and the first insulating member. In a particular embodiment, the Schottky region extends no greater than approximately 50% of the distance between a bottom of the body region and a bottom of the second trench. In another particular embodiment, the process further includes forming a contact opening after forming the gate electrode, wherein patterning the semiconductor layer to define the second trench is performed after forming the contact opening. In a more particular embodiment, the process further includes forming a source region, wherein in a finished device, the body region is disposed between the source region and the substrate, and doping a portion of the semiconductor layer adjacent to the second trench to form a body contact region within the body region. In another more particular embodiment, patterning the semiconductor layer to define the second trench comprises etching a first portion of the semiconductor layer to expose a portion of the body region along the second trench before forming the body contact region; and patterning the semiconductor layer to define the second trench further comprises etching a second portion of the semiconductor layer such that the second trench extends to a depth below the body region, wherein etching the second portion is performed after forming the body contact region.

In a further particular embodiment of the second aspect, the second portion of the second conductive structure directly contacts the source region, the body contact region, and the semiconductor layer below the body region. In a more particular embodiment, the process further includes electrically connecting the first and second conductive structures to each other. In another embodiment, the first trench extends to a first depth as measured from the primary surface, the second trench extends to a second depth as measured from the primary surface, and the second depth is within approximately 20% of the first depth.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising a transistor structure, comprising:
   a patterned semiconductor layer overlying a substrate and having a primary surface, wherein the patterned semiconductor layer defines a first trench and a second trench that extend from the primary surface towards the substrate;
   a first conductive structure within the first trench;
   a gate electrode within the first trench and overlying the first conductive structure;
   a first insulating member within the second trench; and
   a second conductive structure within the second trench, wherein:
      the second conductive structure includes a first portion and a second portion overlying the first portion;
      the first insulating member is disposed between the patterned semiconductor layer and the first portion of the second conductive structure; and
      the second portion of the second conductive structure contacts the patterned semiconductor layer at a Schottky region.

2. The electronic device of claim 1, wherein the first trench is wider than the second trench.

3. The electronic device of claim 1, wherein, within the second trench, the first portion of the second conductive structure is narrower than the second portion of the second conductive structure.

4. The electronic device of claim 1, further comprising:
   a body region disposed over the Schottky region;
   a second insulating member disposed between the first conductive structure and patterned semiconductor layer; and
   a gate dielectric layer disposed between the gate electrode and the body region, wherein the gate dielectric layer is thinner than the second insulating member.

5. The electronic device of claim 4, further comprising:
   a source region disposed over the body region; and
   a body contact region within the body region and adjacent to the second trench,
   wherein the second conductive structure directly contacts the source region and the body contact region.

6. The electronic device of claim 1, further comprising:
   another first trench defined by the patterned semiconductor layer; and
   another gate electrode within the other first trench,
   wherein the second trench and second conductive structure are disposed between the first trenches and first gate electrodes.

7. The electronic device of claim 1, wherein the first portion of the second conductive structure and the second portion of the second conductive structure comprise different materials.

8. The electronic device of claim 7, wherein:
   the first portion comprises doped polycrystalline silicon; and
   the second portion comprises tungsten.

9. The electronic device of claim 1, further comprising a second insulating member between the first conductive structure and the gate electrode, wherein, in a finished device, the first conductive structure and the second conductive structure are electrically connected to each other.

10. A process of forming an electronic device comprising:
    providing a workpiece including a semiconductor layer over a substrate, wherein the semiconductor layer has a primary surface;
    patterning the semiconductor layer to define a first trench that extends from the primary surface towards the substrate;
    forming a first conductive structure within the first trench;
    forming a gate electrode within the first trench after forming the first conductive structure;
    patterning the semiconductor layer to define a second trench that extends from the primary surface towards the substrate;
    forming a first insulating member within the second trench; and
    forming a second conductive structure within the second trench after forming the first insulating member, wherein:

the second conductive structure includes a first portion and a second portion overlying the first portion;

the first insulating member is disposed between the patterned semiconductor layer and the first portion of the second conductive structure; and the second portion of the second conductive structure contacts the patterned semiconductor layer at a Schottky region.

11. The process of claim 10, wherein:

patterning the semiconductor layer to define the first trench defines another first trench;

forming the gate electrode forms another gate electrode within the other first trench; and the second conductive structure is disposed within the semiconductor layer between the gate electrodes.

12. The process of claim 10, wherein forming the first insulating member comprises:

forming a first insulating layer within the second trench; and removing a portion of the first insulating layer to form the first insulating member, wherein substantially all of the first insulating member within the second trench lies at an elevation below the primary surface.

13. The process of claim 10, further comprising forming a body region within the semiconductor layer, wherein after forming the second conductive structure, the Schottky region is disposed at an elevation between the body region and the first insulating member.

14. The process of claim 13, wherein the Schottky region extends no greater than approximately 50% of the distance between a bottom of the body region and a bottom of the second trench.

15. The process of claim 13, further comprising forming a contact opening after forming the gate electrode, wherein patterning the semiconductor layer to define the second trench is performed after forming the contact opening.

16. The process of claim 15, further comprising:

forming a source region, wherein in a finished device, the body region is disposed between the source region and the substrate; and doping a portion of the semiconductor layer adjacent to the second trench to form a body contact region within the body region.

17. The process of claim 15, wherein:

patterning the semiconductor layer to define the second trench comprises etching a first portion of the semiconductor layer to expose a portion of the body region along the second trench before forming the body contact region; and patterning the semiconductor layer to define the second trench further comprises etching a second portion of the semiconductor layer such that the second trench extends to a depth below the body region, wherein etching the second portion is performed after forming the body contact region.

18. The process of claim 13, wherein the second portion of the second conductive structure directly contacts the source region, the body contact region, and the semiconductor layer below the body region.

19. The process of claim 18, further comprising electrically connecting the first and second conductive structures to each other.

20. The process of claim 10, wherein:

the first trench extends to a first depth as measured from the primary surface;

the second trench extends to a second depth as measured from the primary surface; and the second depth is within approximately 20% of the first depth.

* * * * *